(12) United States Patent
Sanjuan et al.

(10) Patent No.: US 8,581,113 B2
(45) Date of Patent: Nov. 12, 2013

(54) LOW COST HIGH FREQUENCY DEVICE PACKAGE AND METHODS

(75) Inventors: Eric A. Sanjuan, San Jose, CA (US); Sean S. Cahill, Palo Alto, CA (US)

(73) Assignee: Bridgewave Communications, Inc., Santa Clara, CA (US)

(*) Notice: Subject to any disclaimer, the term of this patent is extended or adjusted under 35 U.S.C. 154(b) by 1483 days.

(21) Appl. No.: 11/960,681

(22) Filed: Dec. 19, 2007

(65) Prior Publication Data

US 2009/0159320 A1 Jun. 25, 2009

(51) Int. Cl.
*H05K 1/11* (2006.01)

(52) U.S. Cl.
USPC ............ 174/263; 174/262; 257/668; 257/664

(58) Field of Classification Search
USPC .................... 174/263, 262; 257/668, 664
See application file for complete search history.

(56) References Cited

U.S. PATENT DOCUMENTS

| | | |
|---|---|---|
| 3,469,684 A | 9/1969 | Keady et al. |
| 4,276,558 A | 6/1981 | Ho et al. |
| 4,453,142 A * | 6/1984 | Murphy ........................ 333/26 |
| 4,581,291 A | 4/1986 | Bongianni |
| 4,626,805 A | 12/1986 | Jones |
| 4,673,904 A | 6/1987 | Landis |
| 4,776,087 A | 10/1988 | Cronin et al. |
| 4,816,323 A | 3/1989 | Inoue |
| 4,816,618 A | 3/1989 | Bongianni |
| 4,959,900 A | 10/1990 | De Givry et al. |
| 5,014,115 A * | 5/1991 | Moser ........................... 257/659 |
| 5,052,105 A | 10/1991 | Mische et al. |
| 5,151,770 A | 9/1992 | Inoue |
| 5,168,432 A | 12/1992 | Murphy et al. |
| 5,268,326 A | 12/1993 | Lesk et al. |
| 5,321,211 A | 6/1994 | Haslam et al. |
| 5,323,533 A | 6/1994 | Val |
| 5,401,912 A | 3/1995 | Mattel |
| 5,405,808 A | 4/1995 | Rostoker et al. |
| 5,421,083 A | 6/1995 | Suppelsa et al. |
| 5,479,053 A | 12/1995 | Oda |
| 5,517,747 A | 5/1996 | Pierro et al. |
| 5,522,132 A | 6/1996 | Mattei |
| 5,524,339 A | 6/1996 | Gorowitz et al. |
| 5,557,144 A * | 9/1996 | Rosenstock et al. .......... 257/668 |
| 5,576,518 A | 11/1996 | Shibuya et al. |
| 5,592,023 A | 1/1997 | Oda |
| 5,622,898 A | 4/1997 | Zechman |
| 5,656,830 A | 8/1997 | Zechman |
| 5,685,071 A | 11/1997 | Gates, Jr. et al. |
| 5,757,252 A | 5/1998 | Cho et al. |
| 5,824,568 A * | 10/1998 | Zechman ...................... 438/112 |
| 5,847,453 A | 12/1998 | Uematsu et al. |
| 5,889,324 A * | 3/1999 | Suzuki .......................... 257/712 |

(Continued)

OTHER PUBLICATIONS

PCT/US2008/087537 International Preliminary Report on Patentability, dated Jun. 22, 2010.

(Continued)

*Primary Examiner* — Timothy Thompson
*Assistant Examiner* — Andargie M Aychillhum
(74) *Attorney, Agent, or Firm* — DLA Piper LLP (US)

(57) ABSTRACT

A low-cost high-frequency electronic device package and associated fabrication method are described wherein waveguide structures are formed from the high frequency device to the package lead transition. The package lead transition is optimized to take advantage of waveguide interconnect structure.

11 Claims, 10 Drawing Sheets

(56) References Cited

U.S. PATENT DOCUMENTS

| | | |
|---|---|---|
| 5,930,665 A | 7/1999 | Cho et al. |
| 5,949,030 A | 9/1999 | Fasano et al. |
| 6,049,122 A | 4/2000 | Yoneda |
| 6,061,248 A | 5/2000 | Otani et al. |
| 6,191,492 B1 | 2/2001 | Yamazaki et al. |
| 6,192,577 B1 | 2/2001 | Larsson |
| 6,274,391 B1 | 8/2001 | Wachtler et al. |
| 6,448,510 B1 | 9/2002 | Neftin et al. |
| 6,465,896 B1 | 10/2002 | Norskov et al. |
| 6,590,479 B2 | 7/2003 | Yoshida et al. |
| 6,608,390 B2 | 8/2003 | Beatson et al. |
| 6,639,305 B2 | 10/2003 | Carter et al. |
| 6,683,518 B2 * | 1/2004 | Motta ............................ 335/151 |
| 6,770,822 B2 | 8/2004 | Pasternak et al. |
| 6,870,273 B2 * | 3/2005 | Tao et al. ...................... 257/778 |
| 6,960,031 B2 | 11/2005 | McFarland et al. |
| 7,098,530 B2 | 8/2006 | Jansman et al. |
| 2003/0159262 A1 | 8/2003 | Pasternak et al. |
| 2003/0168250 A1 * | 9/2003 | Pasternak et al. ............. 174/256 |
| 2007/0040254 A1 | 2/2007 | Lopez |

OTHER PUBLICATIONS

PCT/US2008/087537 International Search Report, dated Feb. 19, 2009.
PCT/US2008/087537 Written Opinion, dated Feb. 19, 2009.
JEDEC Publication 95—Design Guide 4.8, Date: Jan. 2004 (14 pgs.).
JEDEC Publication 95—Design Guide 4.20, Date: Mar. 2006 (12 pgs.).

\* cited by examiner

LOW COST HIGH FREQUENCY DEVICE PACKAGE AND METHODS

FIELD

Methods for designing and fabricating high-frequency device packages and high-frequency packages are provided and, in particular, a method for fabricating a high frequency package having waveguide-based chip interconnects and planar waveguide suitable external connections is provided.

BACKGROUND

Electronic devices and components are operating at ever increasing speeds and over increasing frequency ranges. For this reason, electronic device packages can become a source of performance degradation, often leading high-frequency system designers to dispense with a package altogether. Such "bare die" approaches frequently give inconsistent performance as the devices are subjected to environmental stresses to a greater degree than packaged devices. Commonly available high-frequency packages, often constructed from metal and ceramic laminates, address some of the concerns imparted by standard package approaches in that they bring controlled-impedance planar waveguide structures such as microstrip and coplanar waveguide (CPW) interconnects very close to the device. Device and waveguide are then connected by a short wire bond, ribbon bond, or flip-chip bump. While this provides a performance improvement, bonds and bumps still do not comprise waveguide structures, and therefore create signal mismatch at each occurrence. Solitary bonds and bumps are inductors at high frequencies, and therefore a matching network structure is typically constructed on the device, package, or printed circuit board (PCB) in order to cancel the effect of the inductance. This solution then results in frequency range or bandwidth limitations for the device-package-PCB system. A further drawback of this approach is that the typical high-frequency package is much more expensive than its common low-frequency counterpart, which is usually fabricated from a single layer of metal and transfer or injection molded plastic.

There is clearly a need to provide a high-frequency package that has the cost structure of low-frequency packages, while providing performance suitable for high-frequency systems. Such a package would ideally take advantage of the low-cost molded plastic lead-frame package infrastructure and would have waveguide interconnects from the device all the way to the PCB. One additional constraint would be that the completed package would be compliant with generally accepted norms for standard pick-and-place and solder attach to the PCB. Package attach approaches that are exotic or non-standard will add to the overall cost of such a solution.

Previous attempts have been made to address the aforementioned issues. For example, U.S. Pat. No. 5,323,533 to Christian Val discloses a surface mount package whose wire bonds and external package leads have controlled impedance, and a coaxial structure. Unfortunately, the transition regions from internal wire bond terminal to the external leads are not controlled in their impedance, and are unshielded. Additionally, the external leads necessitate exotic lead attachment means that are not generally available in industry, impacting the cost-structure and adoptability of such an approach.

In another example, U.S. Pat. No. 5,522,132 to Carmelo J. Mattei, attempts to address the shortcomings of the aforementioned approach by creating what is described as " . . . a quasi-coaxial transmission line through the insulating substrate." The patent teaches that their feed-through approach permits the electrical impedance to be controlled. This approach, while an improvement in some aspects, requires a non-standard package attachment method to be employed, and is not generally compatible with low-cost molded plastic lead-frame approaches, as it requires multiple isolated metallic components that are neither attached to central die-attachment surface nor to a lead frame periphery.

U.S. Pat. No. 5,622,898 to John H. Zechman discloses insulator-coated wires in circuit packaging, and describes the main advantages of such a procedure as precluding short circuiting due to movement of wires during encapsulation. The inventor also mentions the possibility of metal coatings on the insulator-coated wires to reduce inductance and electrical noise. There is no mention of impedance match, nor are the interconnect transitions considered. There is also no mention of any package configuration, including surface mount packages.

U.S. Pat. No. 6,639,305 B2 to Jerry L. Carter, et al, describes a surface mount package suitable for use at higher frequencies that does take advantage of low-cost molded plastic lead-frame approaches. The approach has the potential to be low-cost and is compliant with industry standard lead-attach means. The patent states that the construction will allow " . . . efficient transmission of signals higher than a few GHz." The limitation to a few GHz is due to the fact that the interconnect structure is not designed to be impedance matched, nor does it comprise a waveguide or transmission line interconnect. The described interconnect is an unshielded lead, in which " . . . the next level assembly incorporates the necessary impedance matching . . . " by which one skilled in the art would take to mean that elements external to the package should be used to compensate the lumped-inductance of the lead. As was previously described, this approach still results in frequency range or bandwidth limitations for the device-package-PCB system. In addition, the approach ignores the impact of cross talk from the unshielded lead.

U.S. Pat. No. 6,770,822 B2, filed by some of the same applicants for the current Invention, describes a surface mount package with integral shielding and controlled impedance from the circuit device to the PCB, with good high frequency performance attributes. The use of coaxial vias, while excellent from an electrical performance and possible package hermeticity standpoint, necessitates exotic lead attachment means that are not generally available in industry, impacting the cost-structure and adoptability for low-coast applications of such an approach. Additionally, the coaxial package utilizes a construction approach that is not generally available in the package industry, adding further to the cost-structure limitations.

Thus, it is desirable to provide a high frequency package and method of making the same and it is to this end that the disclosure is directed.

DETAILED DESCRIPTION OF ONE OR MORE EMBODIMENTS

Figure 1:
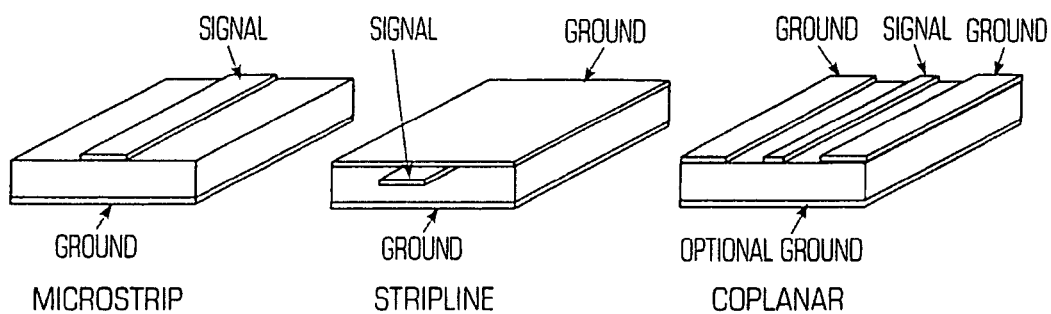
FIG. 1 illustrates microstrip, stripline, and coplanar waveguides.

The high frequency device and method are particularly applicable to microwave and millimeter-wave device packaging and it is in this context that the package and method will be described. It will be appreciated, however, that the device package and packaging method in accordance with the invention has greater utility, since it can be used to package any device that operates from DC to high frequencies, or any device where matched impedance and/or signal integrity is of great importance.

A high frequency device package and method address the above problems with conventional packages. The high frequency device package is provided with impedance-matched waveguide structures along the entire signal route from the circuit device through to the printed circuit board (PCB) connection. This is accomplished utilizing a low-cost industry-standard packaging and package-attach approach. This package is suitable for high-speed applications.

A surface mount package capable of low-loss transmission of signals ranging in operational frequency from DC to in excess of 70 GHz without substantial loss at any of the included frequencies is described. The surface mount package has excellent signal integrity and the package has substantial shielding of leads that minimizes cross talk, radiative loss of signals, and signal dispersion. The surface mount package may be created by utilizing commonly available package creation means, such as a lead frame molded into a dielectric. The structure of the lead frame and molded dielectric is optimized in such a way as to provide impedance-matched connection from the internal package lead terminal to the external package PCB connection. The package geometry is optimized to provide for incorporation of controlled impedance waveguide structures to form low-loss impedance matched chip to package lead interconnects.

The high frequency device package conforms, in its external appearance and surfaces, with industry standard package to PCB attachment means and geometries. This allows the user to employ generally available low-cost package placement and attachment means and thus minimizes the barriers for adoption. In keeping with this objective, the package is designed according to industry standards for the package outline, and external lead geometry. The JEDEC (Joint Electron Device Engineering Councils) Solid State Technology Association has published design guides and standards around which one may design "industry standard" device packages.

By way of example, one embodiment of the high frequency package is realized with a variation on the industry standard quad-flat no-lead, or QFN, package of the open cavity variety. JEDEC Publication 95—Design Guides 4.8 and 4.20 address the aforementioned package styles. This type of package, as generally produced, can operate well to frequencies of several GHz. The embodiment of the high frequency device provides a QFN package; allows for use of impedance controlled coaxial waveguide interconnects within the package and connecting to device(s); and transforms from coaxial interconnect to planar waveguide interconnect such as would be used at the PCB level. The commonly available packages of the QFN open-cavity variety do not provide these capabilities.

Planar waveguides are typically one of three common varieties: microstrip, stripline, and coplanar waveguide (CPW) as seen in FIG. 1. The devices are waveguides because they have both signal and ground leads held in a specific geometric arrangement that allows for controlled impedance. The CPW configuration in particular is implemented through the arrangement of three leads in a ground-signal-ground (GSG) arrangement on single plane. The width of the signal lead, and the gaps between the signal and ground leads, and the dielectric constant of the substrate material are key determinants of the impedance of the CPW configuration. The stripline has a similar GSG configuration, but the arrangement is layered in stacked planes rather than on a single plane, rendering it more complex for attachment to a PCB.

Figure 2:
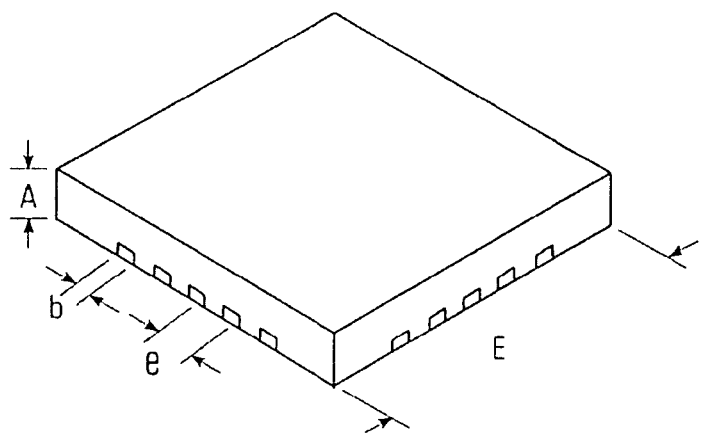
FIG. 2 illustrates a typical JEDEC standard quad flat no lead package (QFN) device.

Leadframe-style packages lend themselves to consideration as quasi-CPW or quasi-stripline waveguides. Three adjacent leads on the leadframe may be configured in a GSG arrangement so that a waveguide-like structure is achieved. A standard QFN package (FIG. 2) may range in lateral dimension (parameter E) from 3.0 to 12.0 mm in increments of 0.5 mm. Typical terminals range in width (parameter b) from 0.15 to 0.5 mm, range in pitch (parameter e) from 0.4 to 1.27 mm, and have a thickness from seating plane to upper terminal surface of 0.2 mm and overall height (parameter A) of 0.3 to 1.0 mm. Given this range of dimensions, a wide range of impedances may be realized, crudely estimated as variable from 30-120Ω's with a typical plastic material of dielectric constant value ranging from 3.5-4.0. An impedance of 50Ω is typical for the I/O's of devices operating in the 10's of GHz such as millimeter-wave integrated circuits (MMICs). The typical desired impedance for device packages, utilizing a GSG structure, is thus achievable within the allowed dimensional ranges of industry standard QFN packages. Thus, a high frequency package with impedance controlled waveguide interconnects may be achieved through proper choice of dimensions and material dielectric constant.

The aforementioned waveguide interconnects may be achieved through various mechanisms. Such structures include two-conductor transmission lines which can be realized with two parallel wirebonds or ribbon bonds on the same plane. Three and more wire variations exist which have improved performance over two-wire approaches, but whose geometries, and consequent impedances, are harder to control in practice. One bond is the signal lead, and the other lead(s) are the related ground(s) for that signal. Two or more ribbon bond geometries, known as parallel plate transmission lines, are also possible, but have geometric control issues as well.

Coaxial transmission lines have readily controlled geometries, and are preferred in this application. These coaxial lines also have variants, including fully-shielded and partially-shielded designs. Partially-shielded variants have some advantages, including thinner dielectric layers for a given impedance. This is because as the area of the shield ground is reduced, the dielectric thickness must also be reduced to maintain the characteristic impedance. Such a thinner dielectric can be a process advantage. Fully-shielded devices have a completely enclosing ground shield, and thus have the advantage of lower signal leakage to the surrounding environment and neighboring interconnects. For these latter reasons, the fully-shielded coax is preferred for applications requiring excellent signal integrity, and will thus be the focus of subsequent discussions. It should be noted that the discussion does not preclude the use of the aforementioned alternative waveguide structures where suitable.

Matching the impedances between two structures is not a sufficient condition for efficient energy transfer in waveguides. In a CPW, energy is distributed primarily in the two gaps between the signal lead, and the ground electrodes adjacent to it. This shaping of the electromagnetic energy is known as the mode shape. Similarly, in a coaxial waveguide in its lowest order mode, the energy fills the entire space between the center conductor and the outer ground shield. The fundamental modes in the respective waveguides are very different in shape, thus coupling from one waveguide structure to another can cause reflections that are detrimental to performance. For this reason, it is important to blend the energy distribution shapes as smoothly as possible from one waveguide type to another. This blend region is known as a transition.

Figure 3:
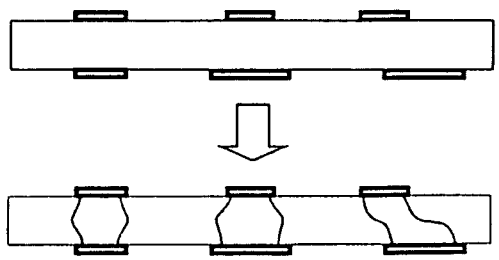
FIG. 3 illustrates a front-to-back lithography and etch method.

Metal leadframes may be fabricated through numerous means, including machining, plating and stamping. One of the most common approaches is photolithography and etching of a rolled copper alloy foil, or sheet. In this latter instance, photolithographic patterns are transferred to both the front and back surfaces of the copper alloy sheet, and etching proceeds from both surfaces. Commonly, the front and back patterns are identical and align precisely with one another. However, different patterns may be transferred to the front and back surfaces, and complex shapes may be achieved (FIG. 3). The aforementioned JEDEC Design Guides do not limit dimensions and spacings internal to the package, but only define the external elements. Complex three-dimensional (3-D) shapes created with dissimilar front and back photolithographic patterns allow for sculpting of signal lead and ground lead shapes such as may be useful for creating mode transforming structures that transform from CPW, with its planar GSG configuration, to a coaxial bond wire, with its concentric signal-insulator-ground structure. Thus, two-sided forming to create 3-D mode transforming shapes in the metallic leadframe may be used to manufacture high frequency device packages.

The transforming structures are typically not simple geometric blends of one shape into another. This is because both spacings and shapes control reactive impedance. Analytical and numerical analysis tools are brought to bear to optimize the overall performance of the transition region. Both frequency-domain and time-domain approaches are useful for this purpose. Frequency domain analysis allows one to assess performance at any given frequency over the entire frequency band of interest. Time domain analysis allows one to identify trouble spots in the transmission path, which can cause energy reflections. Localizing the source of mismatches permits optimization of the geometries of leads and adjacent spaces for improved performance.

Figure 4A:
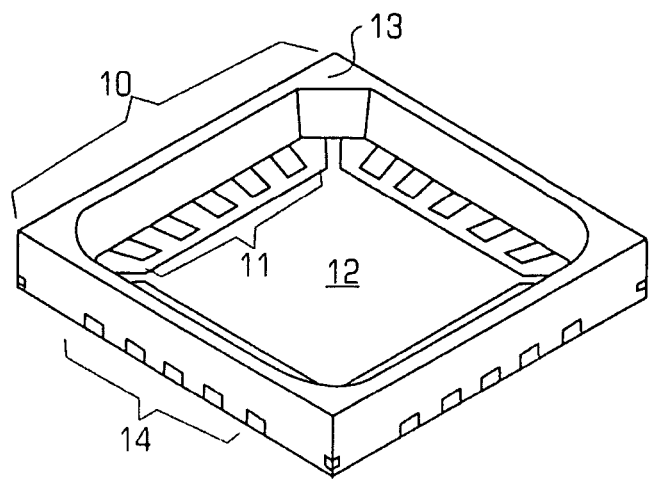
FIGS. 4A and 4B illustrate an isometric view and a bottom view, respectively, of a typical open cavity QFN package.
Figure 4B:
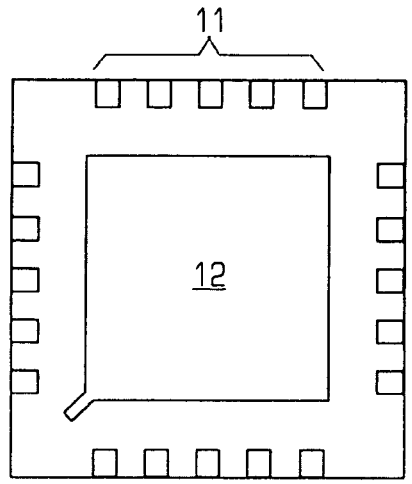

FIG. 4a is an isometric view of a typical QFN open-cavity package (10). The leads (11) are all separate and of uniform width, and the so-called "thermal enhancement" option provides a metallic base (12), onto which an electronic device may be attached. The leads extend through the plastic compound of the package (13) and their ends (14) are visible on the sides of the package. FIG. 4b is a bottom view of this same package, with leads (11) and thermally enhanced base (12). The pictured package is compliant with current JEDEC design guidelines.

Figure 5A:
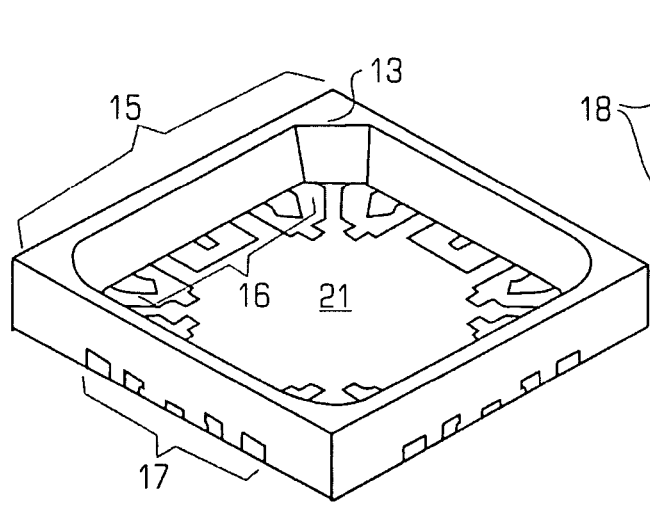
FIGS. 5A and 5B are an isometric view and bottom view, respectively, of an embodiment of an open cavity QFN high frequency device.
Figure 5B:
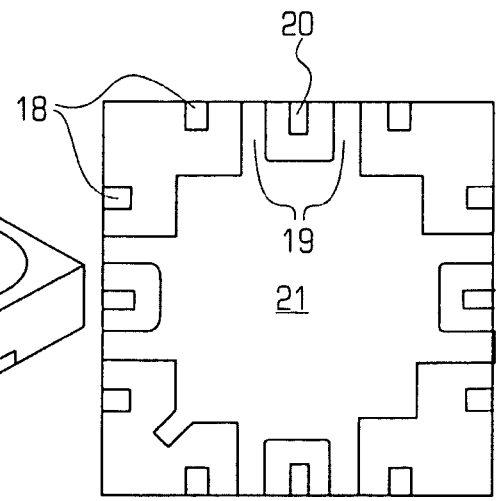

FIG. 5a is an isometric view of an embodiment of the package of a high frequency package (15). The leads (16) are of differing widths and have different end shapes (17), but fall within the current JEDEC design guidelines for lead width, length, and spacing. The outline of the package is substantially identical to the typical package. FIG. 5b is a bottom view of the high frequency package. Three lead types are visible, low frequency signal leads (18) (similar to the typical leads in the conventional package), one or more ground leads (19) that are electrically common to the thermally enhanced metallic base (21), and one or more high-frequency signal leads (20) that as shown in FIG. 5B are surrounded by the package which is a plastic material so that a quasi-coaxial structure is formed. The signal lead width and ground lead spacing are chosen to (a) comply with package attach standards, (b) achieve 50Ω impedance, and (c) allow for optimal CPW on PCB to coaxial bond wire transition with minimal signal degradation.

As was previously discussed, the JEDEC guidelines allow for a range of implementations. A typical parameter e (lead pitch) value of 0.65 mm allows for parameter b (terminal width) values of 0.25 to 0.35 mm. Resulting ground lead spacing can vary from 0.30 mm to 0.40 mm. In a preferred embodiment for this pitch, the signal lead width is chosen to be 0.25 mm, and the ground lead spacing is chosen to be 0.35 mm, and the ground lead width is chosen to be 0.35 mm. This results in a center-to-center lead pitch of 0.65 mm, in compliance with the guidelines, while allowing for performance consistent with objectives.

Figure 6:
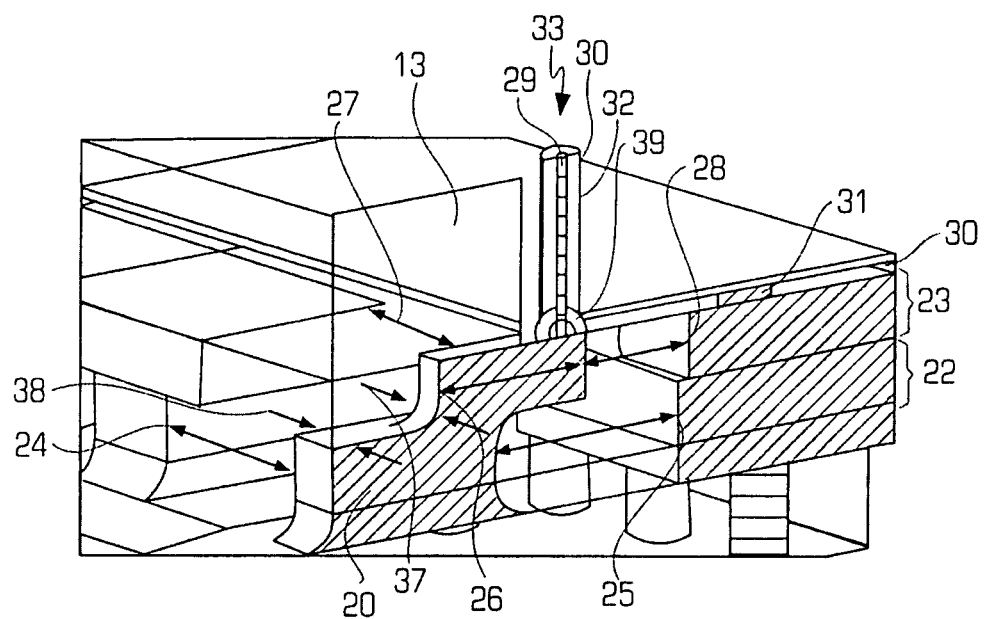
FIG. 6 is a cross-sectional view of the high-frequency device shown in FIGS. 5A and 5B.
Figure 7:
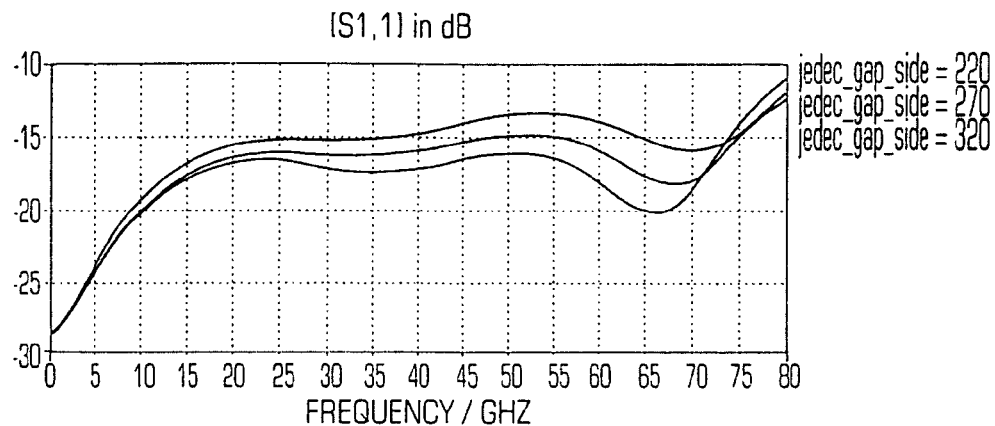
FIG. 7 illustrates the effect of a change in the JEDEC side gap on return loss performance of a high frequency device.
Figure 8:
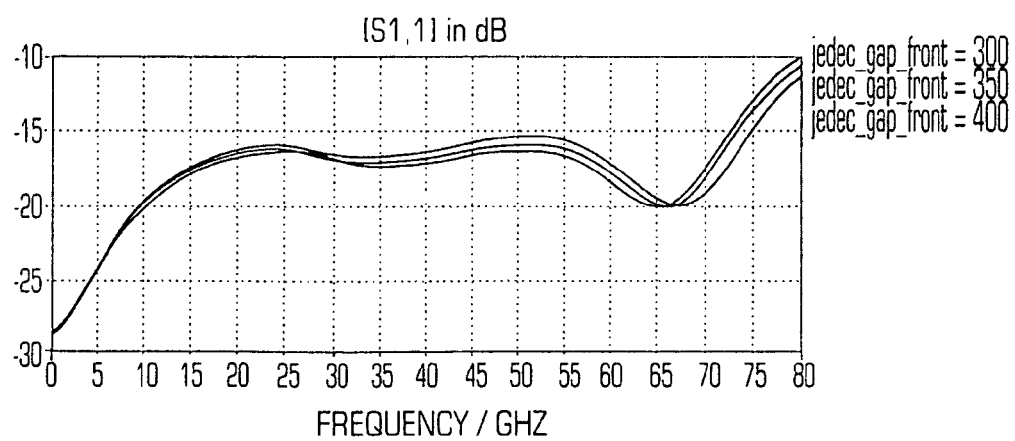
FIG. 8 illustrates the effect of a change in the JEDEC front gap on return loss performance of a high frequency device.

The high frequency leads (that may be input ports) have several parameters that can be varied in order to optimize performance (FIG. 6). Because of the lithographic process used to define the shapes, parameters of concern are easily divided by layer. A bottom layer (22) is defined to a large extent by JEDEC compliance requirements, and thus is referred to as the JEDEC layer. A top layer (23), is referred to as the Leadframe layer. Example parameters are ground lead spacing, ie JEDEC side gap (24), JEDEC front gap (25), Leadframe signal length (26), Leadframe side gap (27), and Leadframe front gap (28). A length refers to an attribute of a metal lead (18) or (20), which is electrically and mechanically isolated from the thermal base (21). Lead lengths can vary from 0.30 mm to 0.65 mm. A gap refers to the spaces between metal parts that are filled with the mold material, which is typically a thermoset epoxy specific for package molding such as are available from Sumitomo or Henkel. As shown in FIG. 6 (which is a cross section), the signal lead (20) shown is split down the middle. As a result, leadframe width (37) and the JEDEC width (38) are shown at half of their actual size. Each of the parameters has some influence on performance, but some are much more significant in their effect than others. FIGS. 7 and 8 show the results of frequency domain models. The effect of varying the JEDEC side gap (FIG. 7) is quite significant. FIG. 8 shows the effect of varying the JEDEC front gap, which is relatively small. Parameters also have interactive effects, which can be quite challenging to adequately characterize. For this reason, it is helpful to create parameterized electromagnetic models, which can automatically vary parameters, and optimize for the best performance.

Such optimization criteria might include minimizing S21 (insertion loss) and S11 (return loss), while maximizing bandwidth for frequency domain models and minimizing the effects of dimensional variation and tolerance on performance.

Figure 9:
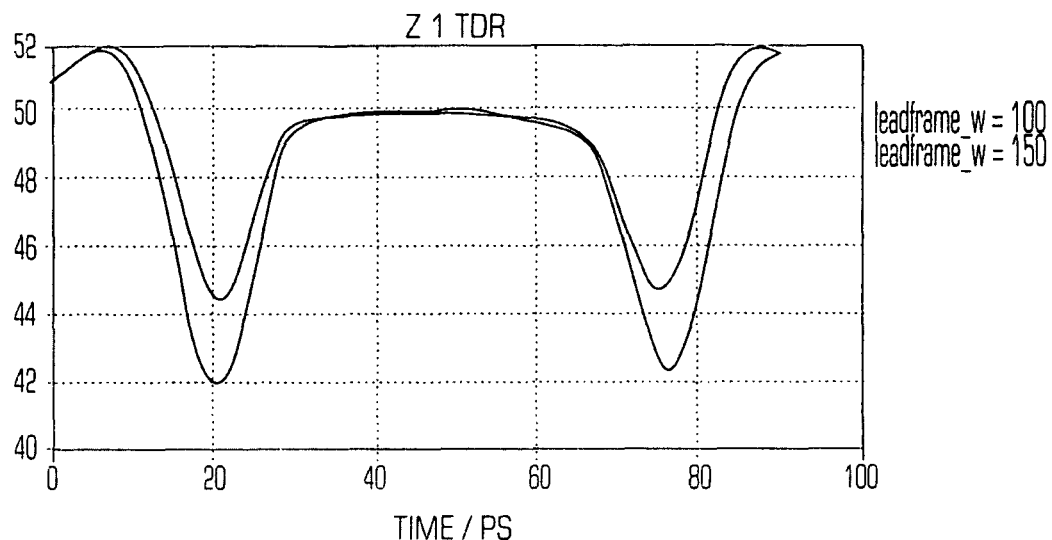
FIG. 9 illustrates the effect of a change in the JEDEC signal width on impedance of a high frequency device.
Figure 10:
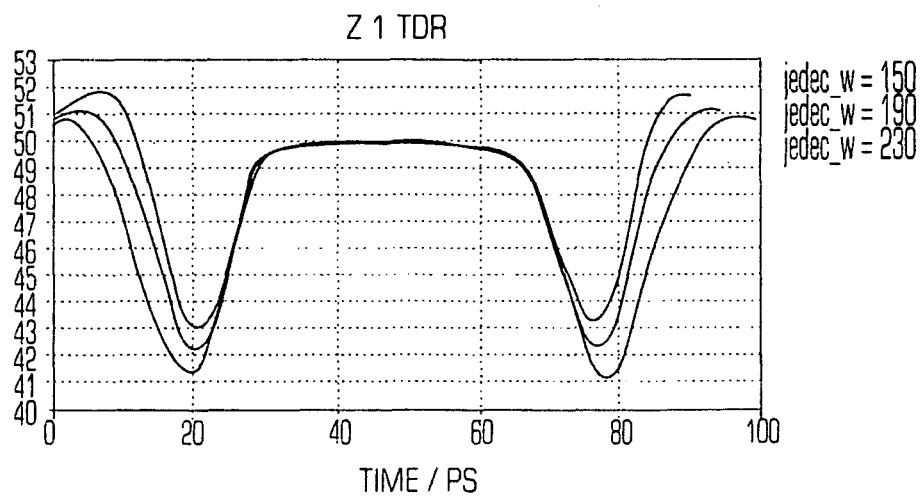
FIG. 10 illustrates the effect of a change in the leadframe signal width on impedance.
Figure 11:
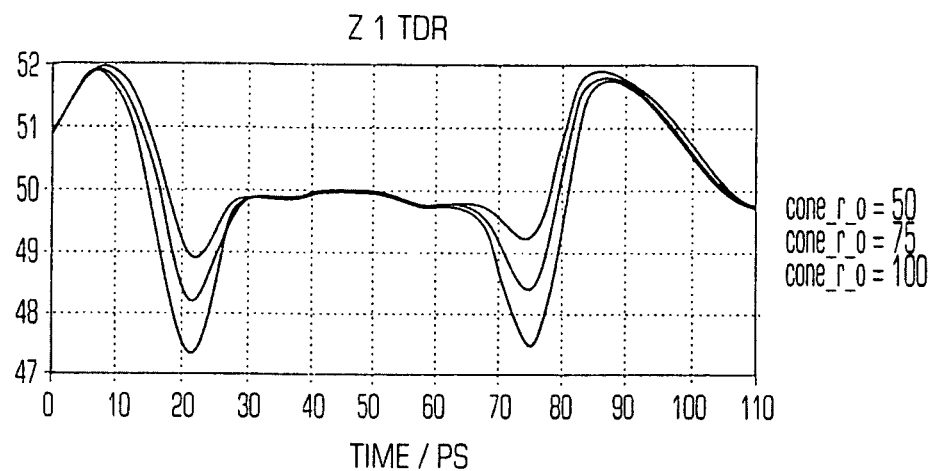
FIG. 11 illustrates the effect of a change in the wirebond parameter on impedance.

Time domain models such as TDR (time domain reflectometry) are similarly useful for optimization. The models are useful for probing discontinuities in the signal propagation path. The greater the reflected signal, the worse the impedance mismatch at a given propagation distance into the path. Thus, the actual location of impedance mismatch can be established. With this tool, one would optimize for best impedance match and least reflected energy. FIG. 9, FIG. 10, and FIG. 11 show the impact of the variation of different parameters on the instantaneous impedance as energy travels from the simulated PCB, through the package leads, and into the coaxial bondwire towards the chip and out through a reciprocal path. The effect of the chip is ignored for the purpose of these models. An ideal characteristic for this embodiment is a constant 50Ω impedance for the entire signal propagation path.

Thus, modeling allows one to optimize the design of quasi-CPW inputs of the package for performance criteria such as impedance and signal integrity. The present-day leadframe and transfer molding fabrication methods as well as assembly technologies place some limits on the achievable geometries in such a package. It is anticipated that fabrication technology improvements will permit consequent improvements in achievable designs and package performance, and it is the intent of this document to incorporate those anticipated improvements herein.

For the current example of open-cavity QFN, a standard package would have a series of evenly spaced leads of largely rectangular section and uniform width. The leads might have notches to enhance retention of the metal pieces within the molded plastic matrix and would extend well under the package sidewall with little consideration of proximity to ground (FIG. 4), except as it affected leadframe formation processes.

Figure 12:
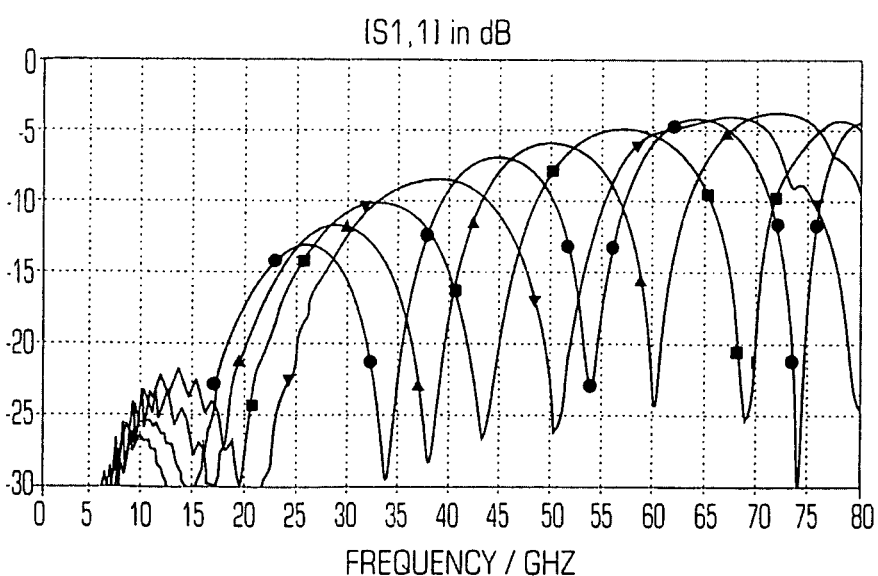
FIG. 12 illustrates poorly optimized return loss performance with length variation.
Figure 13:
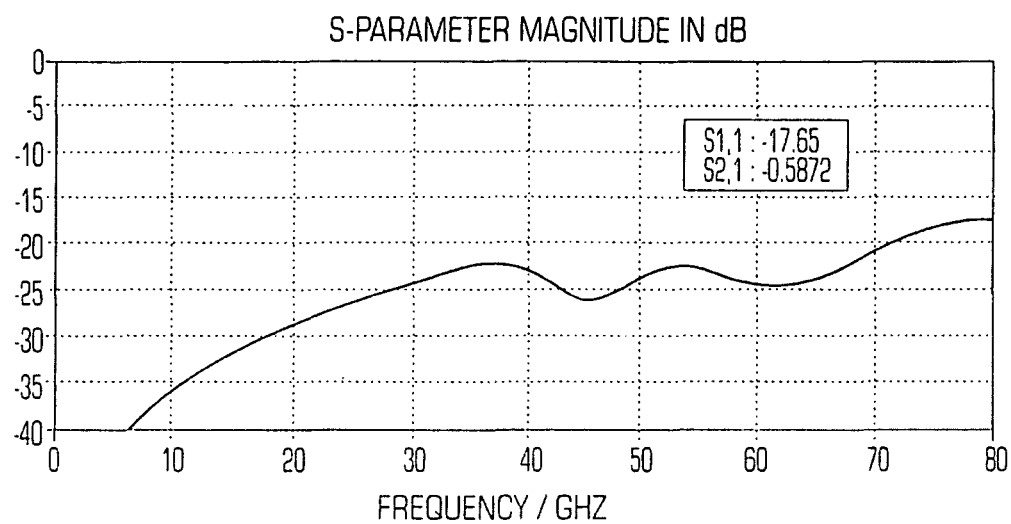
FIG. 13 illustrates well-optimized insertion and return loss performance.

For the high frequency package, deviation from the standard implementation may occur in several ways. Retention notches can remain on the base with minimal impact, but would be eliminated from high frequency signal lead and the portions of the ground leads proximal to the signal lead because notches create inductive regions, which are detrimental to optimizing bandwidth. While width and length portion of the leads present on the external surfaces of the package (JEDEC layer) are limited by the JEDEC standard, internal dimensions would change to enhance performance. The leadframe signal layer is tapered as narrow as is practically allowed by the fabrication technique, while maintaining sufficient area for the bondwire. Utilizing the photolithography and etch technique previously described, the practical lower limit for signal lead width is 100 microns. 35 micron ball bonds can be placed on 45 micron bond pad pitches (±5 micron placement accuracy), so wirebonding is not the limiting factor at this stage. It is reasonable to expect that alternative fabrication techniques and technology advances would allow reduction of the signal lead width dimension even further, perhaps to 50 microns, or even smaller with reductions in wirebond diameter. The narrowed lead is desirable, as it minimizes the lumped shunt capacitance to the coaxial shield ground, at the expense of increasing series inductance. To maintain the desired impedance, the series inductance is compensated by adjusting the signal-to-ground lead spacings on the leadframe layer (FIG. 9). Also, to minimize shunt capacitance to the shield ground, the length of the signal lead protruding under the package sidewall into the cavity is kept as short as is possible while still allowing wirebonder access. The shunt capacitance of concern can also be reduced by addition of extra dielectric (39 in FIG. 6) in the lead-to-wirebond region (FIG. 11). While such additional steps do improve performance, they will also add to cost, so package geometry-oriented solutions are preferred over additional assembly steps where possible. FIG. 12 shows modeled performance for a non-optimized lead structure and coaxial interconnects of different lengths. Return Loss (S1,1) is estimated to be greater than −5 dB at 70 GHz. FIG. 13 shows a design optimized utilizing the above described insights. The design shows significantly improved return loss of <−20 dB, and consequent excellent insertion loss characteristic of <−1 dB.

Figure 14:
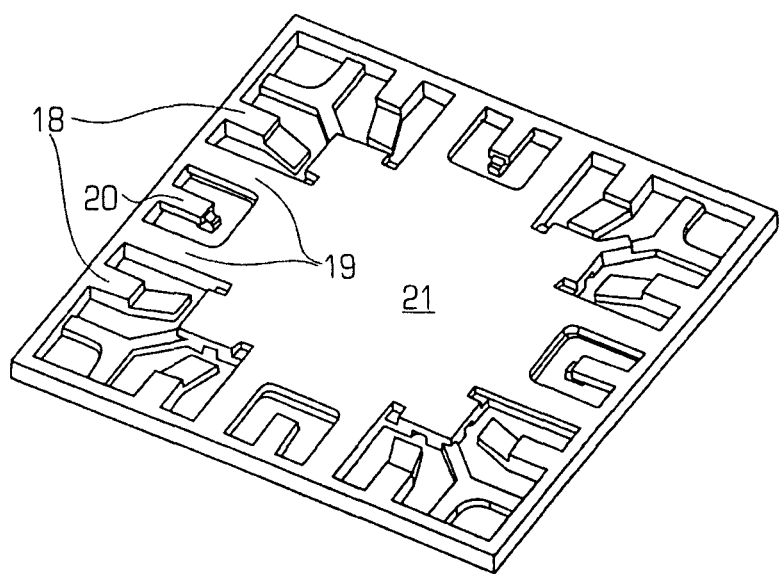
FIG. 14 illustrates a leadframe with a single site package.
Figure 15:
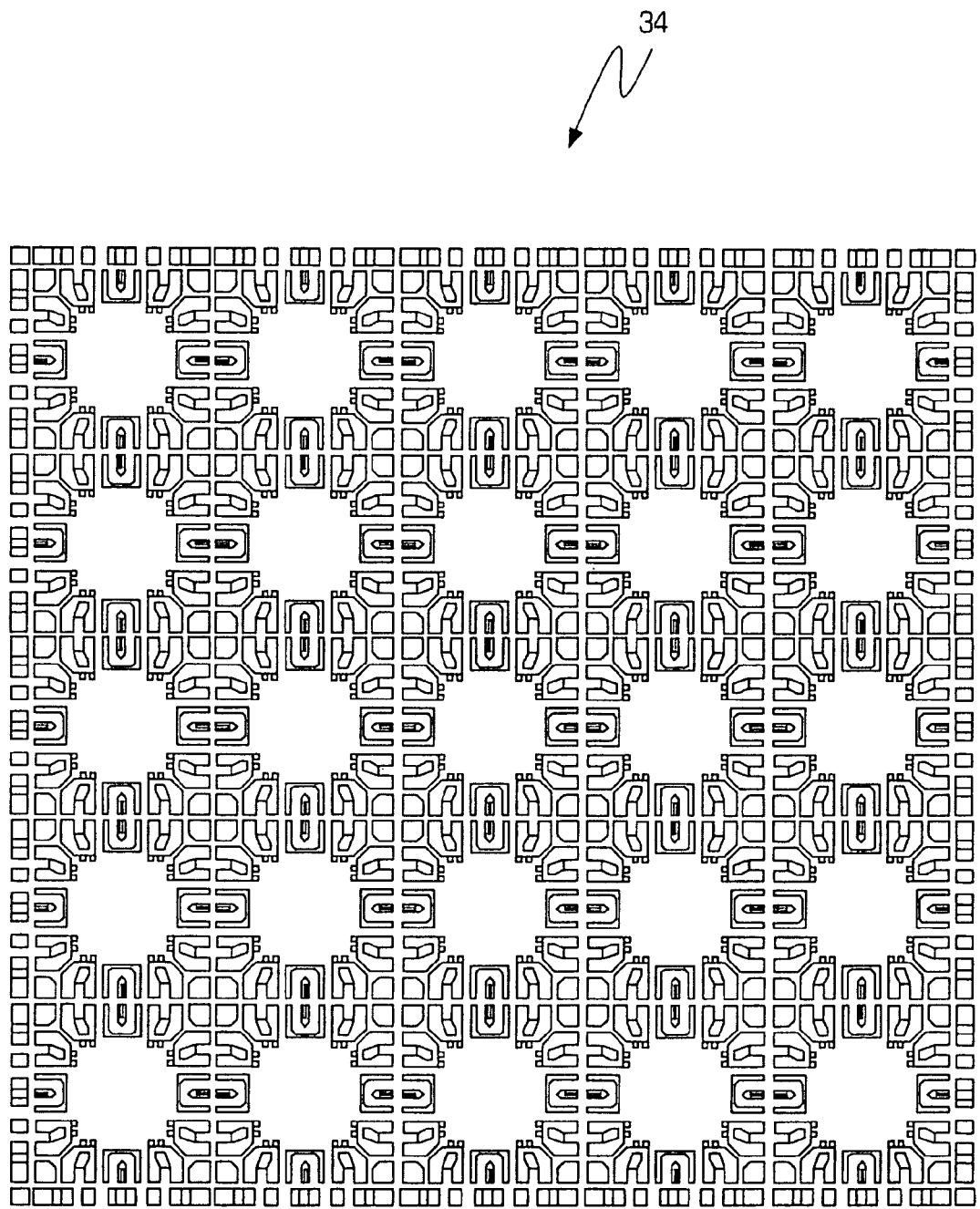
FIG. 15 illustrates a two-dimensional array of single package sites for strip.
Figure 16:
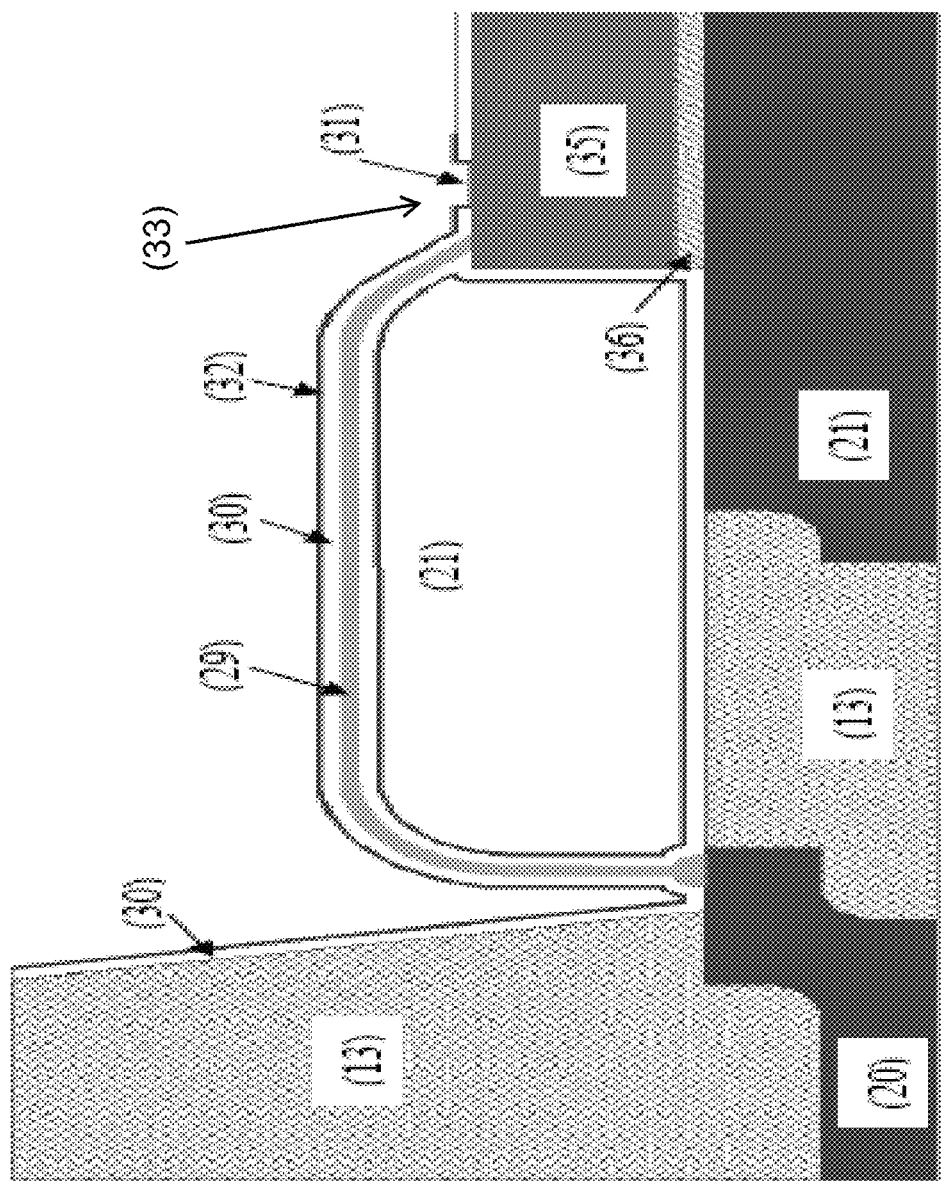
FIG. 16 is a cross-sectional view of an assembled high frequency package.

In an embodiment, an optimized leadframe strip (34), containing a two-dimensional array of individual (FIG. 14) package sites and outside frame portion, is fabricated through aforementioned etching, stamping, or other means as in FIG. 15. In one embodiment (FIG. 16), the electronic device to be packaged (35) is not included in the assembly at this juncture, but in possible variants of the process, including so-called over-molded designs, one may prefer die-attach and wirebonding steps to be completed prior to subsequent molding.

The resultant leadframe strip (34) is placed in a mold of some variety including, but not limited to, an injection molding or transfer molding apparatus. An appropriate dielectric material (13), preferably plastic such as commercially available epoxy mold compound, is injected, pumped or otherwise transferred into the mold to achieve a leadframe/mold material composite structure closely approximating the optimized design. The properties of the mold material (13) are important for their dielectric constant, loss tangent, and electrically dispersive properties as well as their temperature, moisture, and other mechanical performance attributes. Consistent material properties are important for repeatability in the manufacturing process.

Each package site on the resulting leadframe strip is cleaned of mold release material and or mold-flash, and prepared for deposition of a metal finish over the exposed metal portions of the leadframe. This may be accomplished through plating techniques such as immersion or elelctroplating, and the metals would be chosen for corrosion suppression and ease of wirebonding. An example of such finishing is a thin layer of nickel (for protection) followed by a layer of gold (added protection and ability to wirebond).

Each package site of the resultant molded leadframe strip (34) is populated with the required single or multiple die (35), which are attached to the base (21), with die attach material (36) being chosen for mechanical and thermal properties for a particular packaging application. The resultant assembly is then wirebonded (29) as appropriate for each required interconnect. Low frequency and power inputs are connected to the low frequency signal leads (18), of which there are eight in the 20-lead embodiment under discussion. High-frequency inputs and outputs (33), and each is known as a site, are connected to the high frequency signal leads (20). At this juncture, the assembly technique has been essentially identical to that used for common lower frequency packaging approaches, and would be completed with subsequent lidding and dicing steps.

The populated leadframe strip is then subjected to the coating of any essentially conformal insulating layer (30), such as any dielectric, and preferably Parylene. In the case of Parylene, which is vacuum deposited, it may be preferable to mask the bottom of the packages with tape, such as a vacuum-compatible polyimide with acrylic adhesive, or similar material to prevent deposition onto the area of the leads that will eventually attached to the PCB. This will facilitate easier soldering at a subsequent step. The insulating layer in and on the cavity (30) is exposed by well-known techniques, such as laser ablation, in some defined areas over the thermally enhanced base (21) and ground leads (19) in order to form electrical connection, or via (31), to a subsequent ground shield layer (32). The laser-formed vias (31) are also created on or near the ground connections of electrical device (35) being packaged in order to establish a similar electrical ground connection.

The resulting structure is then metallized over the top of the insulating layer to form a ground shield (32). The thickness of the preferred metal layer should be chosen in consideration of skin depth and DC resistance issues, and should be composed primarily of an excellent electrical conductor such as silver, copper, or gold. For most applications, a 1 micron coating thickness is adequate for functionality, but thicker coatings can help minimize cross-talk between leads. These coatings may be added in defined areas through a combination of lithography or other masking methods, and plating or other selective deposition methods.

The combination of the bondwire (29), insulation (30), and shield (32) form a micro-coaxial cable (33 as shown in FIG. 6) having an inner conductive layer (the bond wire 29), and insulator surrounding the inner conductive layer (the insulating layer 30) and the outer-grounded conductive layer (the shield 32). The impedance of the cable is controlled by the choice of bondwire (29) diameter and insulator (30) thickness. The impedance can be selectively controlled for each signal path by choosing a different diameter bondwire for a given thickness of insulator layer. Coaxial impedance can be estimated with well-known formulae that show dependence on the dielectric constant of the insulator material, the core conductor diameter, and the outside diameter of the dielectric layer. Using such a formula, one may estimate the necessary dielectric thickness for a given wirebond diameter. As an example, preferred parameters for a 50Ω line are as follows. A depositable dielectric, Parylene C, has an estimated dielectric constant of 2.73. For a 0.6 mil (15.24 micron) wirebond, the necessary dielectric diameter would be 2.38 mils (60.5 microns). The dielectric deposition thickness would thus be 0.89 mils (22.6 microns). With a 5 micron thick shield layer, the overall coax would be about 70 microns in diameter.

Figure 17:
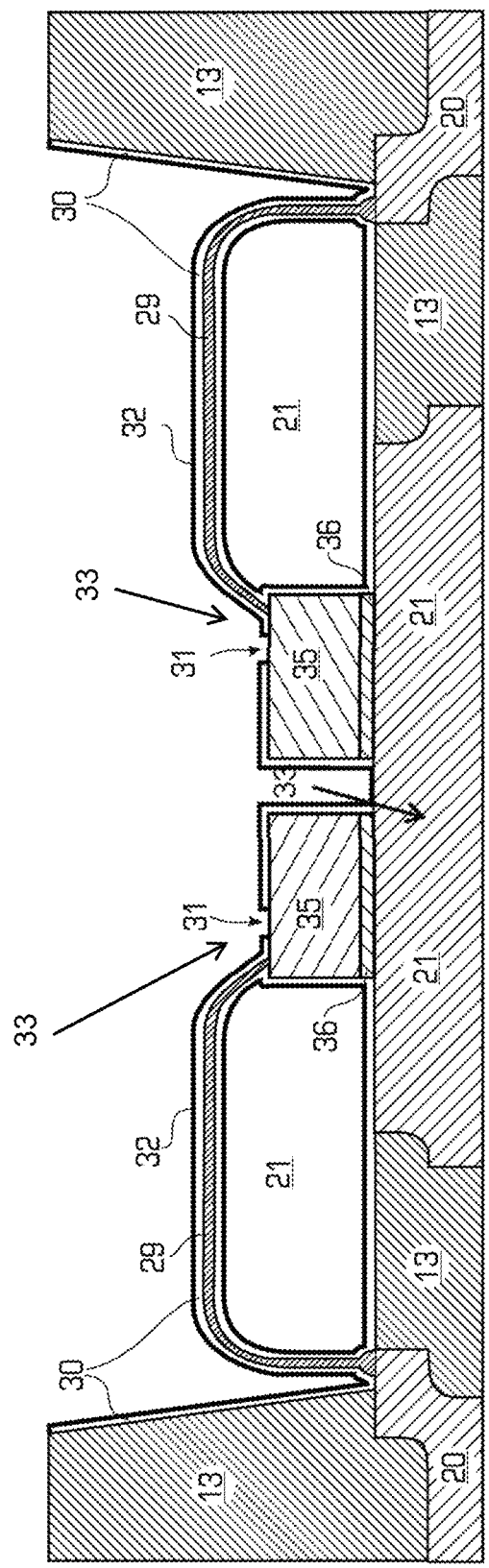
FIG. 17 is a cross-sectional view of an assembled high frequency package with two devices connected to the base.

In the high frequency package, it is possible to mount several devices (35) on the base (21) surface as shown in FIG. 17. It is then possible to create wirebond contacts between bonding pads (sites 33) on these devices and include these wires in the subsequent micro-coaxial formation process in parallel with the wires connected to package high frequency signal leads and low frequency signal leads. This allows the implementation of a hybrid structure with internal micro-coaxial interconnects.

While the foregoing has been with reference to particular embodiments of the invention, it will be appreciated by those skilled in the art that changes in this embodiment may be made without departing from the principles and spirit of the invention, the scope of which is defined by the appended claims.

The invention claimed is:

1. An electrical component package, comprising:
a package having a plurality of leads and a base;
a structure attached to said base, the structure having at least one site; and
at least one waveguide interconnect connecting the at least one site on said structure to at least one of said plurality of leads of the package, wherein the at least one lead attached to waveguide interconnect is tapered to minimize a shunt capacitance at an interface region between the waveguide interconnect and the at least one lead; and
wherein the structure has a second site; and wherein the at least one waveguide interconnect is internal to the package and connects the at least two sites on the structure to each other.

2. The package of claim 1, wherein at least one lead adjacent the lead connected to the waveguide interconnect further comprises an electrical ground lead.

3. The package of claim 1 wherein two leads adjacent the lead connected to the waveguide interconnect each further comprises an electrical ground lead.

4. The package of claim 1, wherein each waveguide interconnect further comprises a shield and wherein the shield has a connection to a ground of the structure.

5. The package of claim 1, wherein each waveguide interconnect further comprises a shield and wherein the shield has a connection to a package lead ground.

6. The package of claim 1, wherein each waveguide interconnect further comprises a shield and wherein the shield has a connection to a package lead ground and a ground of the structure.

7. The package of claim 1, wherein an impedance of the at least one lead is matched to the impedance of the waveguide interconnect.

8. The package of claim 7, wherein the waveguide interconnect impedance is matched to the an impedance of the structure.

9. The package of claim 1 further comprising:
a second structure attached to said base, the structure having at least one site; and
at least one waveguide interconnect connecting the at least one site on the structure attached to said base to the at least one site on a second structure attached to said base.

10. The package of claim 1, wherein each site further comprises a bonding pad.

11. The package of claim 1, wherein each site further comprises a bonding pad.

* * * * *